United States Patent [19]

Luetzow et al.

[11] Patent Number: 5,264,792

[45] Date of Patent: * Nov. 23, 1993

[54] HALL EFFECT POSITION SENSOR WITH FLUX LIMITER AND MAGNETIC DISPERSION POLE PIECE

[75] Inventors: Robert H. Luetzow, Huntington, Ind.; Edwin J. Luetzow, Farmington, Minn.

[73] Assignee: Kearney-National, Inc., White Plains, N.Y.

[*] Notice: The portion of the term of this patent subsequent to May 19, 2009 has been disclaimed.

[21] Appl. No.: 849,883

[22] Filed: Mar. 12, 1992

Related U.S. Application Data

[62] Division of Ser. No. 589,454, Sep. 27, 1990, Pat. No. 5,115,194.

[51] Int. Cl.[5] .......................... G01B 7/30; G01B 7/14; G01P 3/488
[52] U.S. Cl. .................................. 324/207.2; 324/174
[58] Field of Search ..................... 324/173, 174, 207.2, 324/207.21, 207.25, 235, 251, 252; 73/DIG. 3, 518-520; 338/32 R, 32 H; 307/309; 340/671; 341/15

[56] References Cited

U.S. PATENT DOCUMENTS

| | | | |
|---|---|---|---|
| 3,060,370 | 10/1962 | Varterasian | 324/207.2 X |
| 3,359,492 | 12/1967 | Kuhrt et al. | 324/207.2 X |
| 3,777,273 | 12/1973 | Baba et al. | 324/207.21 X |
| 3,900,814 | 8/1975 | Masuda | 324/207.15 X |
| 3,942,045 | 3/1976 | Palazzetti | 324/174 X |
| 4,922,197 | 5/1990 | Juds et al. | 324/207.21 |
| 5,115,194 | 5/1992 | Luetzow et al. | 324/174 X |

*Primary Examiner*—Gerard R. Strecker
*Attorney, Agent, or Firm*—Woodard, Emhardt, Naughton, Moriarty & McNett

[57] ABSTRACT

A low cost Hall effect position sensor is disclosed which includes a Hall effect integrated circuit disposed in close proximity to a metallic target device. The Hall device is mounted on a flanged flux dispersion pole piece. The opposite end of the pole piece is attached to a rare earth or Alnico magnet. The flanged magnetic flux dispersion pole piece is designed to disperse a highly concentrated magnetic flux field from a magnet, typically an Alnico or rare earth magnet, into a low intensity magnetic flux field which is compatible with the Hall effect device as well as constant and evenly dispersed across the face of the flanged pole piece. The area of the dispersion flange face is designed so measured magnetic field in an air gap between the dispersion pole piece and a ferrous target is increased by a factor of 3 when compared to an open circuit field intensity field measurement at the surface of the dispersion pole piece. The open circuit field intensity of the sensor is below the release point of the Hall effect device. When a metallic body or ferrous target is near, the flux at the face of the dispersion pole piece is increased above the operate point of the Hall device and the digital Hall device is activated or "turned on." The dispersion flanged pole piece, the magnet and the Hall device function as an accurate low cost position sensor.

10 Claims, 7 Drawing Sheets

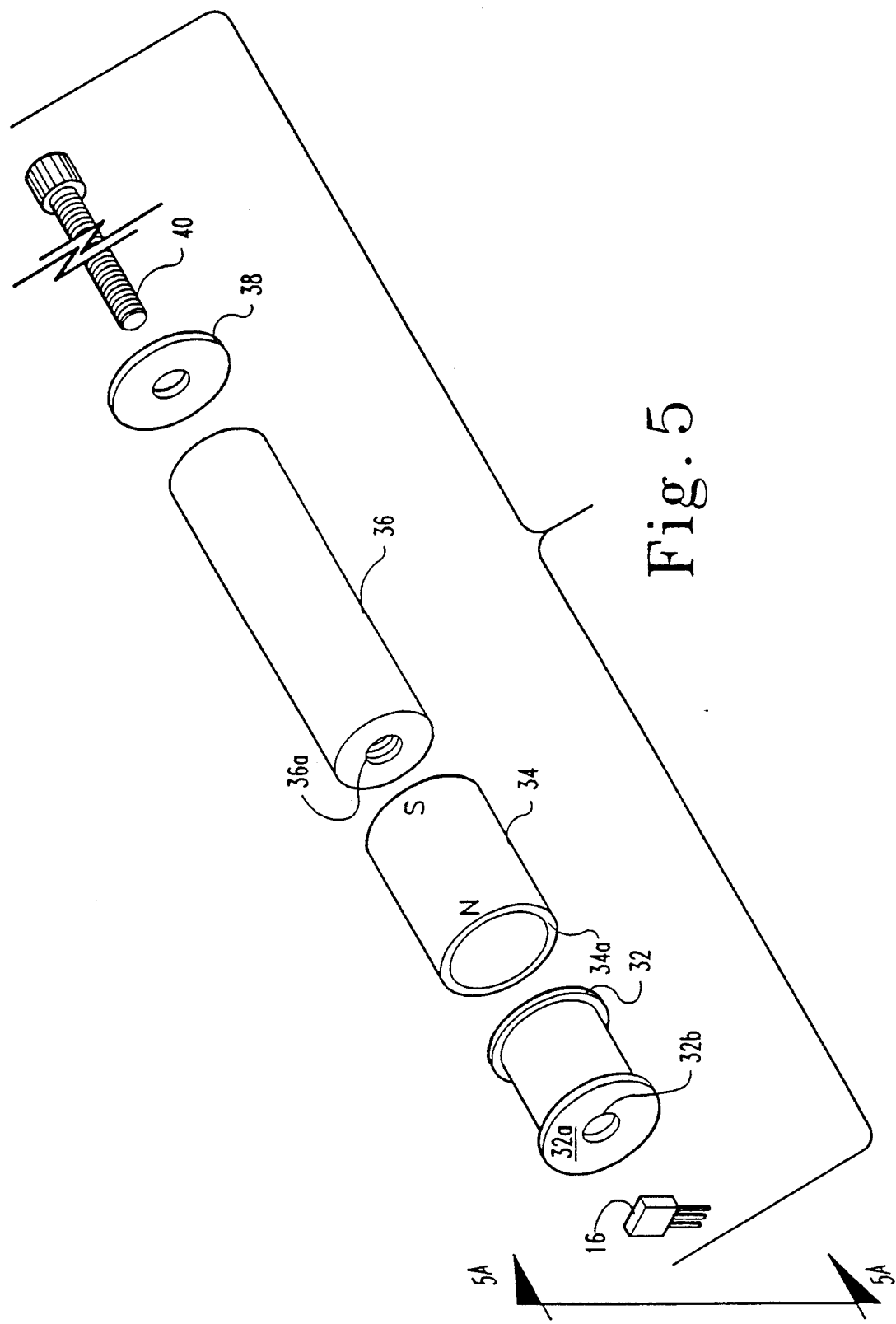

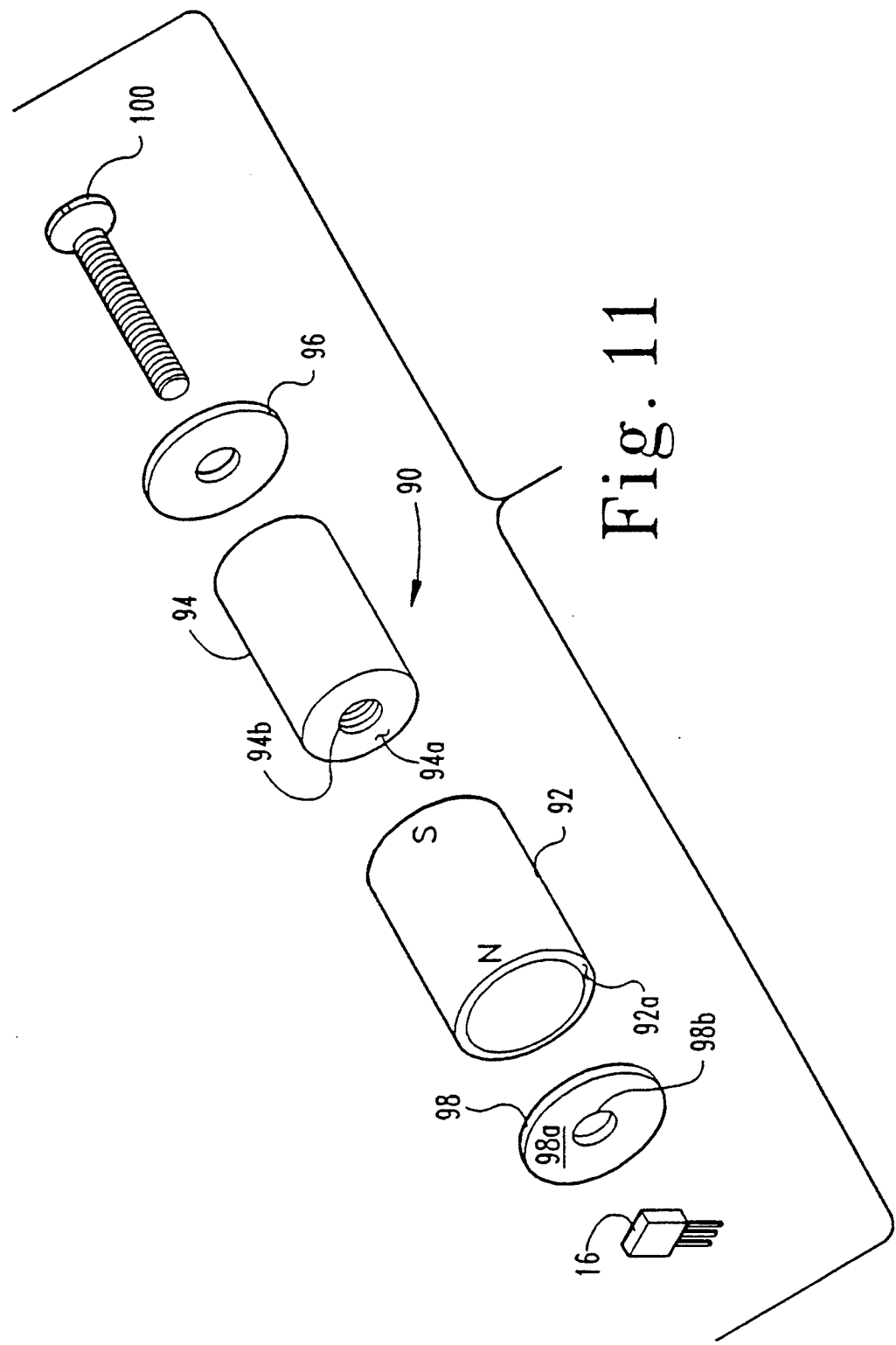

HALL EFFECT POSITION SENSOR WITH FLUX LIMITER AND MAGNETIC DISPERSION POLE PIECE

This application is a division of U.S. patent application Ser. No. 07/589,454, filed Sep. 27, 1990, now U.S. Pat. No. 5,115,194.

BACKGROUND OF THE INVENTION

1. Field of the Invention

This invention pertains to active position sensors such as motion, edge, frequency and speed sensors or counting devices. In particular, it relates to gear tooth sensors incorporating a Hall effect device and which sense the presence or absence of gear teeth or voids in a metallic member as the teeth or voids pass near a sensor device.

2. Description of the Prior Art

Prior art approaches to gear tooth sensors include magneto-resistive devices, proximity switches, and other similar devices. More recently, position sensors incorporating Hall effect devices have been developed which provide a convenient logic signal output when sensing metallic gear teeth or voids. Essentially, when a Hall effect device is placed in a magnetic field and oriented transversely to a current flowing through the device, a voltage output in direct proportion to the strength of the magnetic flux component at right angles to the Hall device is produced. Typically, the Hall device signal is supplied to a transistor and the voltage from the Hall device is used to switch the transistor on and off and produce a logic signal.

Many have developed position sensors which incorporate Hall devices. Most of the prior art devices are susceptible to changes in temperature and sensitive variances in the distance between the gear tooth and the sensor, commonly known as the air gap. One such device is shown in U.S. Pat. No. 4,745,363 to Carr, et al. The device shown in Carr, et al. incorporates spaced apart, offset flux concentrators to provide a sensitive device with favorable tolerances to temperature and air gap.

U.S. Pat. No. 4,293,814 to Boyer and U.S. Pat. No. 4,524,932 to Bodziak both disclose proximity or position sensing devices incorporating Hall effect sensors. Bodziak discloses a Hall effect sensor disposed on the north pole surface of a cubic magnet. The Bodziak magnet/Hall effect sensor assembly is disposed below the rail of a railroad track to sense the metallic wheels of railroad cars as they pass over or near the device. The Bodziak device produces a square wave output or pulse signal in response to detection of a railroad wheel.

The Boyer device operates in substantially a similar manner as the Bodziak device. Neither Bodziak nor Boyer disclose a pole piece disposed between the magnet and the Hall effect device of the sensor assembly. The circuit in Boyer is directed towards providing a self-adjusting threshold voltage for use with a Hall effect sensor. The output of the circuit shown in Boyer provides a square wave signal indicative of the position of a tone wheel with respect to the Hall effect device.

U.S. Pat. No. 4,518,918 to Avery discloses a dual Hall effect sensor wherein two Hall effect devices are mounted on a pole of a magnet and positioned so that one Hall device detects a valley or notch in the gear when simultaneously the other Hall device is detecting the protrusion or tooth of the gear or tone wheel. The outputs of the sensors are fed into a differential amplifier circuit in order to produce a pulse train signal which corresponds to the speed of rotation of the tone wheel.

Other patents disclosing position sensors which incorporate Hall effect devices activated in response to moving magnetic shunts or gear teeth are shown in U.S. Pat. No. 4,853,629 to Rops; U.S. Pat. No. 4,406,272 to Kiess, et al.; and U.S. Pat. No. 4,725,776 to Onodera, et al. U.S. Pat. No. 4,481,469 to Hauler, et al. discloses an alternate approach using a Hall effect device to detect gear teeth. The Hall effect device in the Hauler, et al. sensor is positioned so as to detect the tangential magnetic field rather than the radial magnetic field variations attributable to the rotating tone wheel. Other examples of proximity or position sensors incorporating Hall effect devices are disclosed in U.S. Pat. No. 3,195,941 to Burig, et al. and U.S. Pat. No. 4,859,941 to Higgs, et al.

Consistency of operation as well as ease of manufacture are primary objectives in the design of a position sensor. Various Hall effect devices packaged in plastic-encapsulated three terminal packages are available on the open market. These off-the-shelf devices typically have wide variances in operational characteristics with respect to temperature. In addition, the magnetic flux switch points of the Hall effect device are not always suitable for use in position sensor applications since magnets of corresponding magnetic strength do not provide sufficient flux deviations to operate the Hall devices appropriately over a broad range of conditions such as variable tooth width, height, and wide variances in the air gap requirements. With these thoughts in mind, a new position sensor design which includes a structure to limit and control magnetic flux impinging upon the Hall effect device and includes flux dispersion means for dispersing the magnetic flux so as to produce the widest flux differential in response to the passing of a tooth of a tone wheel and thereby increase sensitivity of the sensor is desired.

SUMMARY OF THE INVENTION

A position sensor according to one aspect of the present invention comprises a Hall effect IC, a temperature stable magnet, a pole piece having first and second opposing ends and also having a central cross-sectional area which is smaller area in a central region of the pole piece as compared with the cross-sectional area of the pole piece at the ends of the pole piece, and wherein the Hall effect IC is attached to the first end of the pole piece and the magnet is attached to the second end of the pole piece.

A position sensor according to another aspect of the present invention comprises a Hall effect IC, a magnetizable metal pole piece having means for limiting flux passing through the pole piece, a magnet coupling member and means for dispersing flux, wherein the Hall effect IC is attached to the means for dispersing, and a permanent magnet attached to the magnet coupling member of the pole piece so that one pole of the magnet is attached to the pole piece.

A position sensor according to another aspect of the present invention comprises a Hall effect device, a hollow cylindrical magnet, a hollow cylindrical non-magnetizable core having an axial length greater than the magnet, the core positioned within and attached to the magnet, an annular ring-shaped pole piece attached to the core and the magnet, a cylindrical pole piece having a first countersunk hole for receiving the core, the countersunk hole extending into a first axial end of the pole piece, the cylindrical pole piece also having a second axial hole extending into a second axial end of the pole piece and communicating with the countersunk hole, the pole piece positioned over the core and abutting the magnet, flux return means for magnetically shunting a portion of the flux from the ring-shaped pole piece to the cylindrical pole piece, the flux return means located and attached within the hollow portion of the core, and wherein the Hall effect IC is attached to the cylindrical pole piece over the second hole.

A Hall effect position sensor according to another aspect of the present invention comprises a Hall effect device, a disk-shaped pole piece having a flux return means protruding from the central portion of the first pole piece, a ring-shaped pole piece having a hole centrally located therein, first and second magnets of equal length and attached between the disk-shaped pole piece and the ring-shaped pole piece so that the flux return means is positioned substantially between the magnets, and wherein the Hall effect device is attached to the ring-shaped pole piece and located adjacent the hole.

A position sensor according to another aspect of the present invention comprises a Hall effect device, a pole piece having a narrower central cross section and first and second ends with cross sectional areas greater in size than the central cross section, the hall effect device attached to the first end, means for compensating temperature changes attached to the second end of the pole piece, a magnet surrounding the means for compensating temperature changes, and wherein the means for compensating and the magnet are coaxial.

A position sensor according to another aspect of the present invention comprises a Hall effect device, a hollow cylindrical magnet having a first base and a second base, a hollow cylindrical non-magnetizable core having an axial length substantially equal to the axial length of the magnet, the core being coaxially positioned within the magnet, a first annular ring-shaped pole piece attached to the first base, a second annular ring-shaped pole piece attached to the second base, flux return means for magnetically shunting a portion of the flux from the first ring-shaped pole piece to the second ring-shaped pole piece, the flux return means inserted through the first pole piece and attached within the hollow portion of the core, and wherein the Hall effect device is attached to the center of the second pole piece.

One object of the present invention is to provide an improved Hall effect position sensor.

Another objective of the present invention is to provide a Hall effect position sensor having a flux limiter limiting means and a magnetic dispersion means so that off-the-shelf Hall effect devices may be implemented in a position sensor design.

Another objective of the present invention is to provide a Hall effect position sensor which has a higher sensitivity to tone wheel position and allows for more variation in operating characteristics such as temperature, air gap, tooth height, void height, and tooth or void width.

These and other objects of the present invention will become more apparent from the following description of the preferred embodiment.

BRIEF DESCRIPTION OF THE DRAWINGS

FIG. 5 is an exploded perspective view of a second embodiment of the Hall effect position sensor according to the present invention.

FIG. 11 is an exploded perspective view of a sixth embodiment of the Hall effect position sensor according to the present invention.

DESCRIPTION OF THE PREFERRED EMBODIMENT

Figure 1:
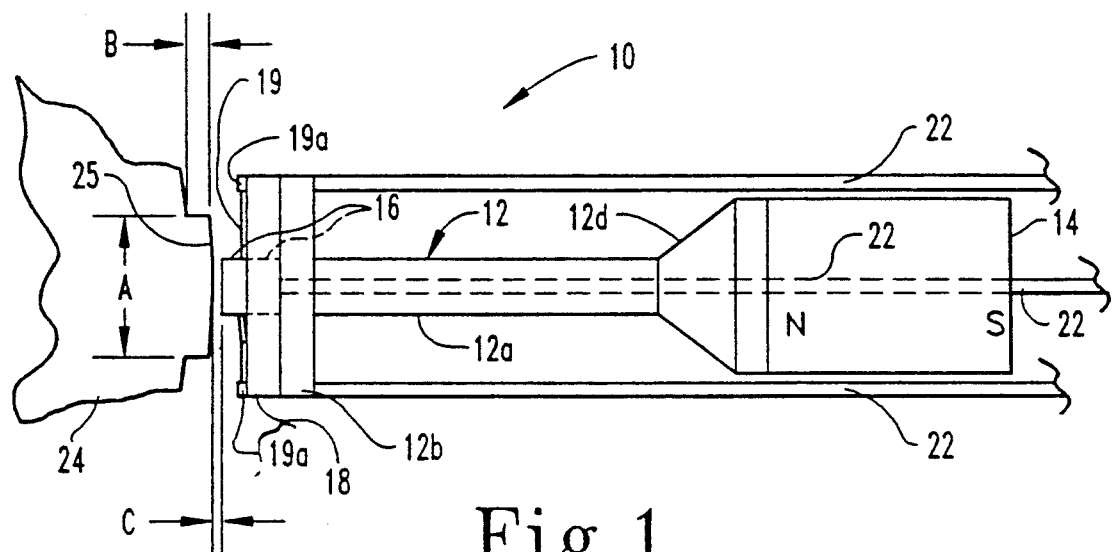
FIG. 1 is a side elevation view of one embodiment of the Hall effect position sensor according to the present invention shown disposed in close proximity to a tone wheel.

For the purposes of promoting an understanding of the principles of the invention, reference will now be made to the embodiment illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates.

Referring now to FIG. 1, a side elevational view of the Hall effect position sensor 10 according to the present invention is shown. The sensor 10 includes pole piece 12, magnet 14, Hall effect device 16 and circuit board 18. The enlarged coupling end 12c of pole piece 12 is intended to insure maximum flux linkage between the pole piece 12 and magnet 14. The magnetic flux from magnet 14 passes through the tapered portion 12b and the neck 12a of the pole piece 12 to the dispersion flange plate 12b at the opposite end of the pole piece. Since like magnetic flux lines repel each other, the magnetic flux lines at the flange plate 12b will distribute themselves across the face of the flange plate 12b with the lowest area of flux density occurring at the center of the flange plate and the highest area of flux density appearing at the outer edges of the flange plate in the "unloaded" state. "Unloaded" means that a tone wheel or gear is not near the sensor 10. See FIG. 3 for an end view of flange plate 12b. As the gear tooth 25 of gear 24 passes near Hall effect device 16, the Hall effect device is subjected to an increase in magnetic flux and produces an output signal indicative of the higher magnetic flux caused by the presence of the tooth 25 near the Hall device 16.

Wires 22 are connected to the leads 17 of Hall device 16 via solder terminal locations 19a and circuit board runners 19. The wires 22 typically carry three signals: power, ground and an output signal (typically a logic zero or logic one) produced by the Hall device 16.

Figures 2, 3:
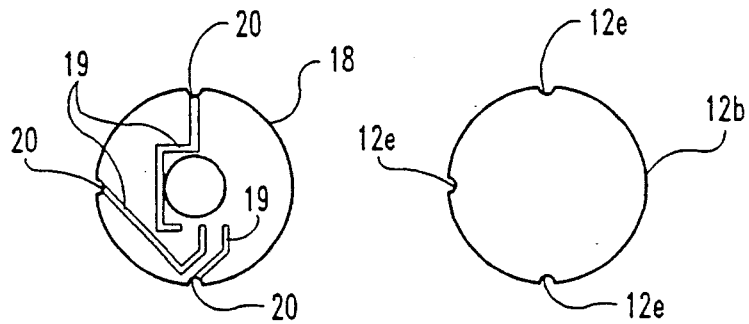
FIG. 2 is a plan view of the circuit board 18 of FIG. 1.
FIG. 3 is an end view of the pole piece flange 12b of pole piece 12 shown in FIG. 1.
Figure 4:
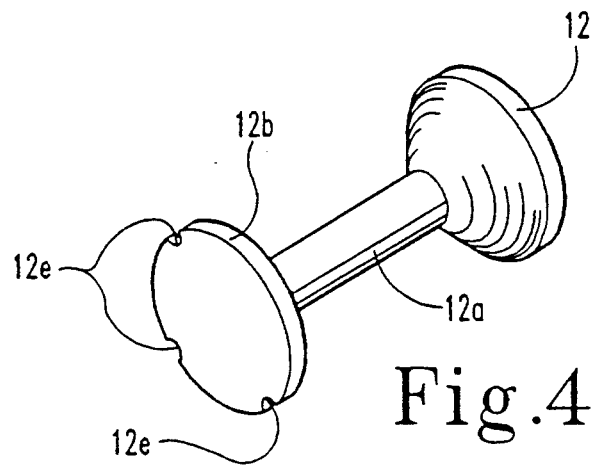
FIG. 4 is a perspective view of the pole piece 12 of FIG. 1.

Suitable Hall effect devices are available from Sprague Inc. for use as Hall device 16. The magnet 14 is an Alnico magnet or a rare earth magnet made of sumariam cobalt or other similar rare earth materials. The pole piece 12 is made of cold rolled steel or other magnetizable metal and may also be made using powdered metal technology. The circuit board 18 is a fiberglass material and includes copper runners 19 as shown in FIG. 2. The copper runners 19 enable convenient connection between the leads of Hall device 16 and wires 22. Notches 20, shown in FIG. 2, provide a convenient dressing location for wires 22. Similarly, notches 12e in flange plate 12b, as shown in FIGS. 3 and 4, also enable convenient locating of wires 22.

The minimum gear tooth width A, minimum gear tooth height B, and operating air gap C for the position sensor 10 are as follows: A=0.050 inches, B=0.064 inches, and C=0.001 to 0.060 inches.

The design of the sensor 10 centers around a flanged magnetic flux diffusing pole piece 12 which enables use of a low cost Hall effect integrated circuit device or IC with operating or switch points in the area of 150 to 375 gauss and hysteresis of less than 90 gauss to be interfaced with a temperature stable high flux density magnet. The flux density of the magnet 14 can be as high as 3,000 gauss or higher when using a properly designed flux dispersion pole piece 12. The pole piece 12 permits the use of temperature stable rare earth and Alnico 8 magnets with low cost mass produced Hall effect ICs designed for low flux density operation. The pole piece neck 12a or flux limiting means may be sized to produce any desired flux intensity below that produced by the magnet at the external surfaces or across the face of flange plate 12b. As is well known in the art, once the flux present in a particular cross section of magnetic material reaches a saturation point, the magnetic material cannot transmit or conduct any additional magnetic flux. Thus, the neck 12a acts as a flux limiting means to limit the amount of flux supplied to the flange plate 12b.

The cross-sectional area of plate portion 12b is approximately 4.5 times the area of the cross-section at neck 12a. A 4.5 area ratio is recommended as a minimum area ratio to achieve a suitable performance of the sensor 10.

Typical dimensions for the sensor 10 are: magnet diameter of 0.375 inch; pole piece neck (12a) diameter of 0.10 inch; pole piece diameter at 12b of 0.550 inch; pole piece diameter at 12c of 0.375 inch; and neck (12a) length of 0.45 inch.

Figure 5A:
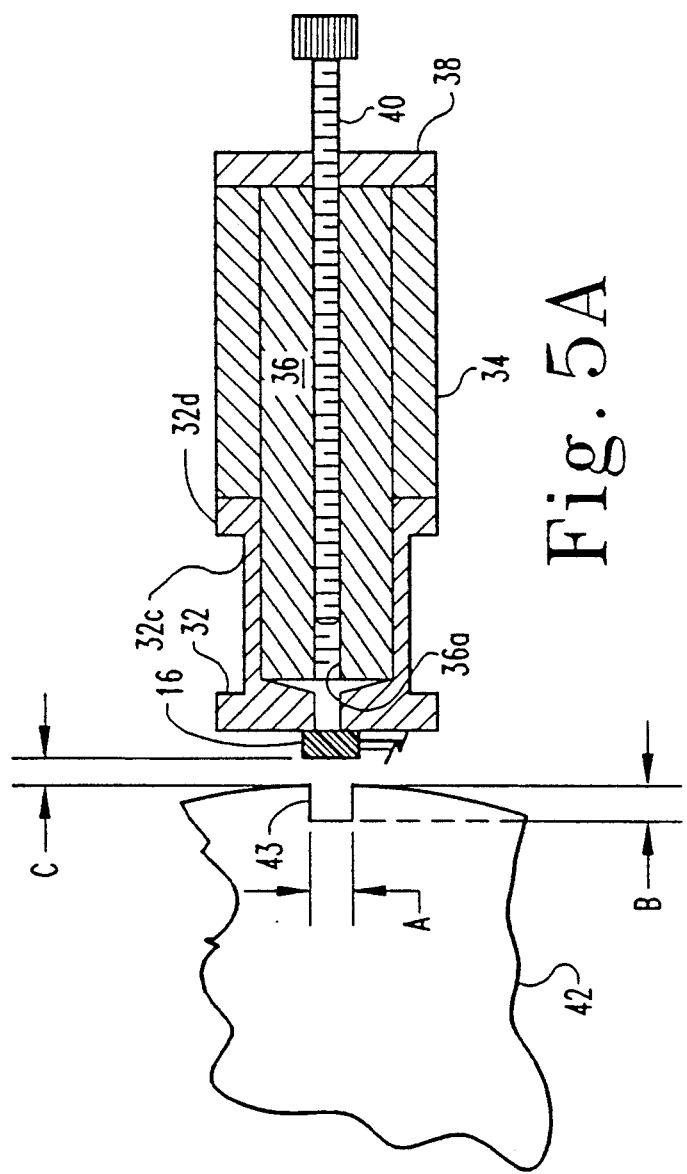
FIG. 5A is a cross-sectional view of the position sensor of FIG. 5 looking in the direction of arrows 5A.

Referring now to FIGS. 5 and 5A, an alternate embodiment of the Hall position sensor 30 according to the present invention is shown. The sensor 30 includes Hall device 16, cylinder and flanged pole piece 32, cylindrical rare earth or Alnico 8 magnet 34, cylindrical threaded aluminum insert 36, disk pole piece 38, and screw 40. The pole piece 32, pole piece 38, and screw 40 are all made of magnetizable materials such as cold rolled steel. The Hall effect device 16 is mounted on the semi-closed end 32a of the flanged cylinder pole piece 32 and centered over the hole 32b. The flanged cylinder pole piece 32 is magnetically coupled with and abuts cylindrical magnet 34. The spool-shaped pole piece 32 and magnet 34 are attached by way of adhesive or other suitable connecting means. The diamagnetic aluminum insert or core 36 with internal threads at 36a is inserted into the cylindrical hole formed by both the pole piece 32 and the magnet 34. A steel washer pole piece 38 is attached on the back end of the sensor 30. The steel machine screw 40 is adjusted into threaded aluminum insert 36. Screw 40 functions as an adjustable magnetic flux return guide to control or limit the magnetic efficiency of the sensor 30 and the magnetic circuit formed by the pole pieces 32 and 38, the screw 40 and magnet 34. The air gap between the Hall effect device 16 and the flux return guide 40 is adjusted for proper sensor operation with a target device or tone wheel selected for a particular application. Thus, the screw 40 acts as a flux limiting means. Gear or tone wheel 42 includes a notch or void 43, wherein the dimension A must be greater than 0.20 inches, the dimension B must be greater than 0.150 inches, and the air gap C is between 0.001 and 0.060 inches.

The cross-sectional area at magnet coupling member 32d is larger than the cross-sectional area at flux limiting member 32c of pole piece 32. The face area 32a of pole piece 32 is optimally at least 4.5 times larger than the cross-sectional area of pole piece 32 at 32c.

As is well known in the art, the permeability of air ($\mu_o$) makes for an ideal flux limiter in the functional operation of sensor 30, thus the user may "dial in" the desired gaussian field intensity appearing at the face 32a of pole piece 32 by adjusting screw 40. Once screw 40 is adjusted appropriately the Hall device 16 is exposed to a broader range of gaussian flux than is otherwise achievable with magnet/pole piece combinations of the prior art thereby improving sensitivity and widening the usable air gap parameter of the sensor 30. Aluminum insert 36 keeps magnetic fringing to a minimum and serves to center the flux return guide 40 within magnet 34.

In a typical application, wires or other electrical connecting means are attached to the leads of device 16 in order to connect the signal produced by Hall device 16 to a circuit capable of monitoring the output signal of the Hall device. Although the sensor 30 as shown includes an adjustable flux return guide 40, the guide 40 may also be a non-threaded steel insert press fitted into the inner passage 36a of aluminum insert 36.

Figure 6:
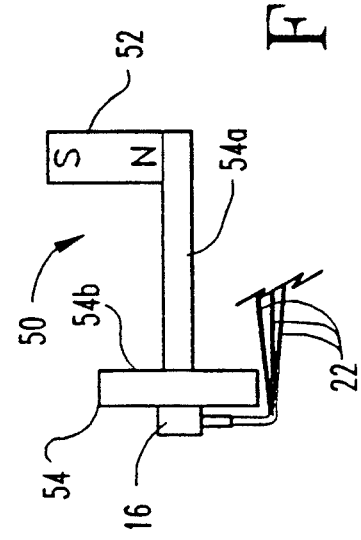
FIG. 6 is a side elevation view of a third embodiment of the Hall effect position sensor according to the present invention.

Referring now to FIG. 6, another embodiment of a position sensor 50 according to the present invention is shown. Position sensor 50 includes essentially the same components of the position sensor 10 of FIG. 1 with the exception of magnet 52 mounted and oriented in a different manner with respect to pole piece 54 for space saving purposes. The component parts of the position sensor 50 are a Hall device 16, flange plate 54B and neck piece 54A comprising the pole piece 54 and magnet 52. Wires 22 are interconnected to the leads of Hall device 16 to enable connection of the Hall device to the appropriate power, ground and signal monitoring terminals of a signal monitoring circuit.

Figure 7:
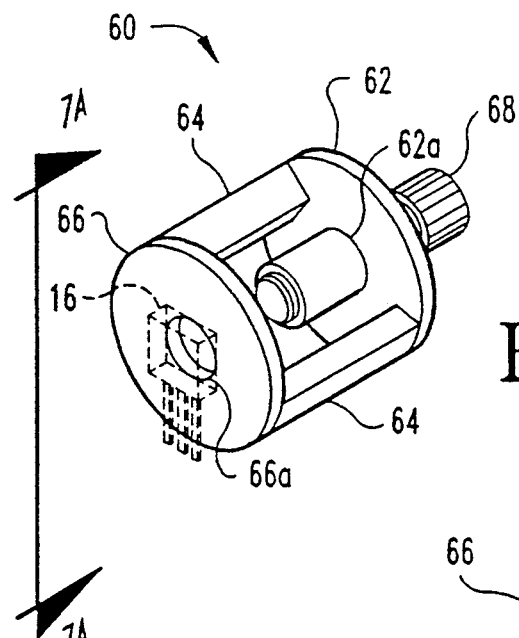
FIG. 7 is a perspective view of a fourth embodiment of the Hall effect position sensor according to the present invention.
Figure 7A:
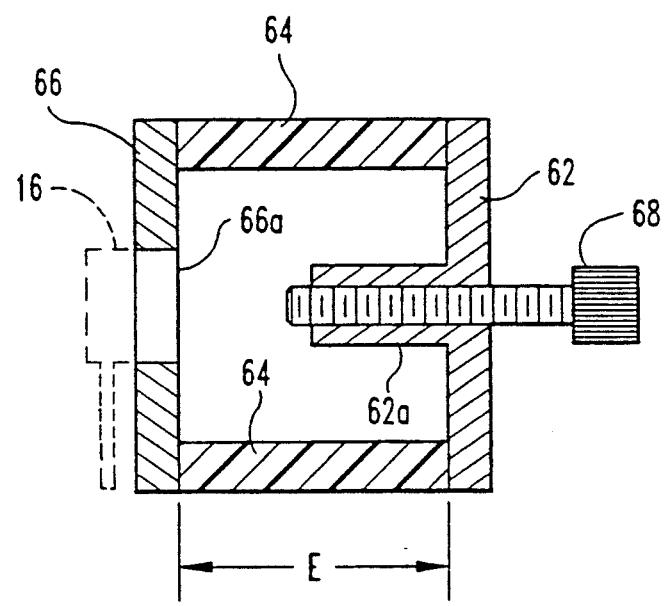
FIG. 7A is a cross-sectional view looking in the direction the arrows labeled 7A of the position sensor shown in FIG. 7.

Referring now to FIGS. 7 and 7A, another embodiment of the position sensor 60 according to the present invention is shown. In this embodiment, the magnetic field from rectangularly shaped magnets 64 is dispersed over the face area of the steel flange plate 66. A cylindrical magnet (similar to magnet 34 of FIG. 5) may serve as a suitable substitute for magnets 64 of sensor 60. The magnetic circuit is completed using steel bottom flange plate 62 and steel machine screw 68. Steel machine screw 68 is adjustable within cylindrical member 62a of rear flange plate 62 to vary the air gap generally indicated at dimension D between Hall effect device 16 and machine screw 68. The measured magnetic field intensity change in the area of the Hall device 16 is controlled by the area of the face of the flange plate 66 and the distance E between the flange plate 66 and the rear flange plate 62. The rare earth magnets 64 can be either round, square, or rectangular in cross section with a length or height corresponding to dimension E. It should be noted however that the cross sectional area of the magnets should be kept as small as possible. A correctly designed flange plate-magnet-hole combination wherein hole 66a is appropriately sized, will generate a field intensity flux change of better than 5 to 1 between unloaded and loaded circuit conditions. Loaded conditions are those wherein a metallic portion of the tone wheel is disposed adjacent the Hall device 16, and open or unloaded circuit conditions are those wherein no tone wheel is located near Hall device 16.

Figure 8:
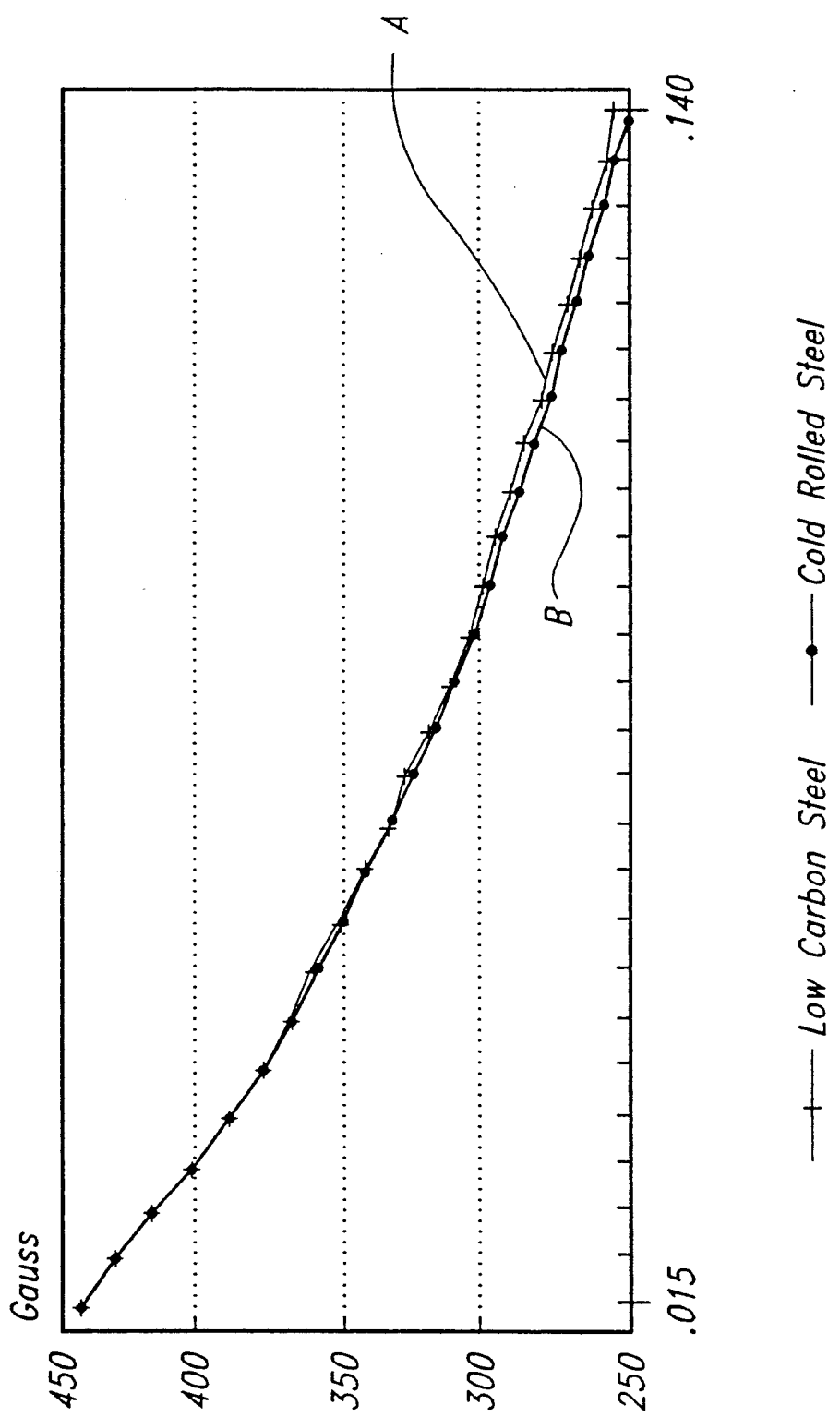
FIG. 8 is a flux density map of flux density versus air gap for cold rolled steel and low carbon steel pole pieces.

Referring now to FIG. 8, two curves A and B show the measured flux density at the center of the loaded flange pole piece 12 of FIG. 1 as the air gap is increased from 0.001 inches to 0.140 inches between the Hall device 16 and the target 24. Curve A is the measured response for a low carbon steel pole piece and curve B is the measured response for a cold rolled steel pole piece. The loaded and unloaded flux intensity of the sensor is designed to occur above and below the operation and release points of the Hall device used for the sensor assembly 10. Thus, if the operating points for the Hall device are 350 gauss and 250 gauss (for latch and release respectively) then an operating air gap of between 0.001 and approximately 0.105 inches would be appropriate according to the curves of FIG. 8. Similar results are obtained with sensors 30, 50, and 60.

Figure 9:
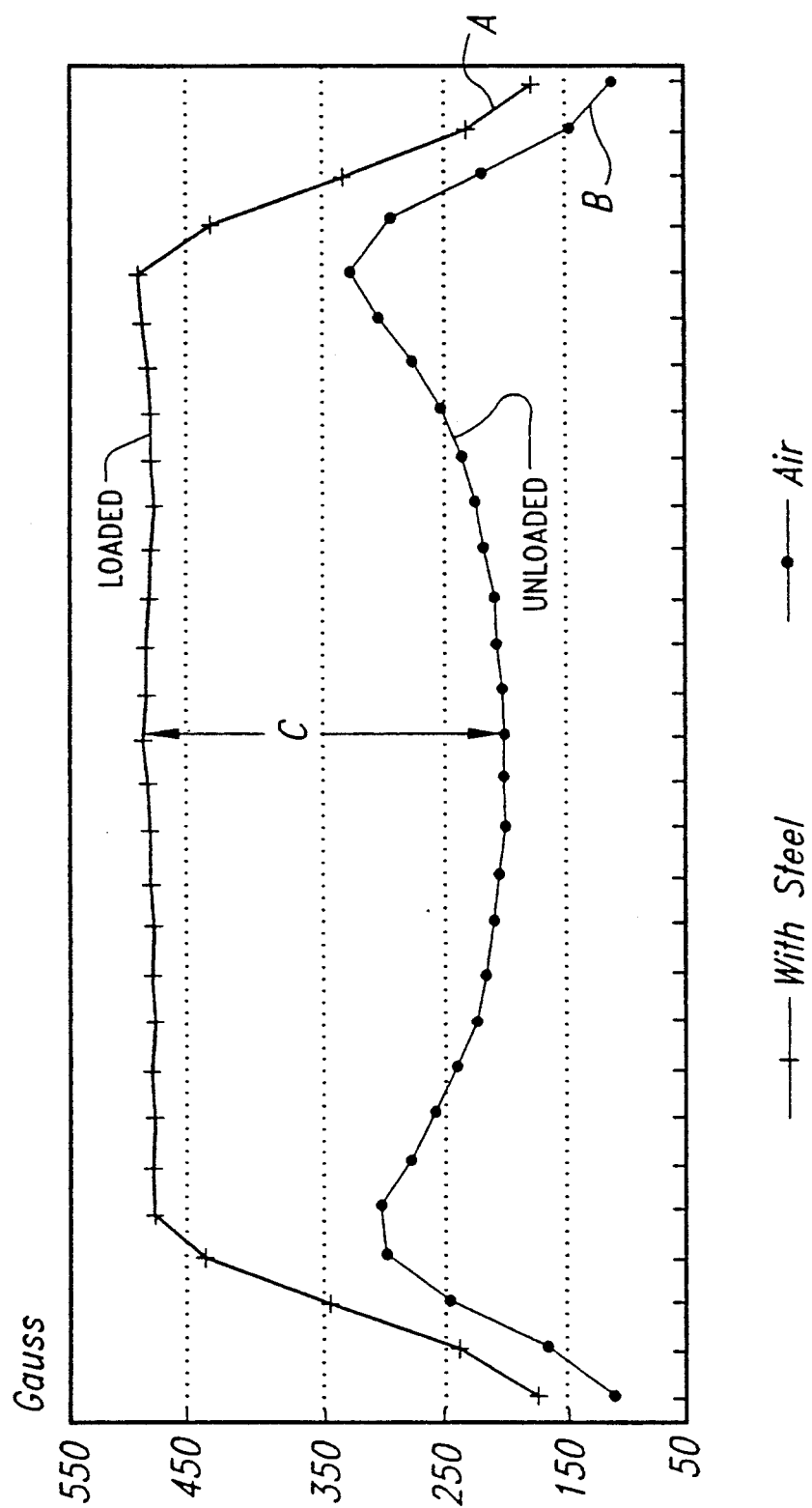
FIG. 9 is a graph illustrating the flux differential between the loaded and unloaded operating states of the position sensor shown in FIG. 1.

Referring now to FIG. 9, a flux density map for the loaded and unloaded conditions of the sensor 10 of FIG. 1 is shown. Curve A corresponds to the loaded condition wherein a target material of magnetizable metal such as steel is located in close proximity to the Hall device 16. The unloaded curve B represents the flux distribution across the face of flange plate 12b when no target device is near. Thus, it can be seen that as much as 300 gauss differential occurs near the center of the flange plate 12b as indicated at C from the loaded to the unloaded operating state for the sensor 10 of FIG. 1. Similar loaded and unloaded flux deviations are achieved with sensors 30, 50, and 60.

Although the devices shown in FIGS. 5 and 7 include adjustable flux return means, such flux return means may be adjusted in a test stand or test apparatus and then the flux return means can be locked, glued or welded in position to provide the appropriate operating characteristics for the sensors 30 and 60 according to the present invention. For high volume mass production applications, a fixed nonadjustable flux return guide can be designed to replace the adjustable screw method disclosed when the adjustment characteristics of the magnetic circuit are known and predictable. Other variations in the sensors as shown may be made in accordance with device size proportioning and magnetic flux capability of the magnets and the permeability of the magnetic circuit components as well as the operational switch points of the Hall device.

Figure 10:
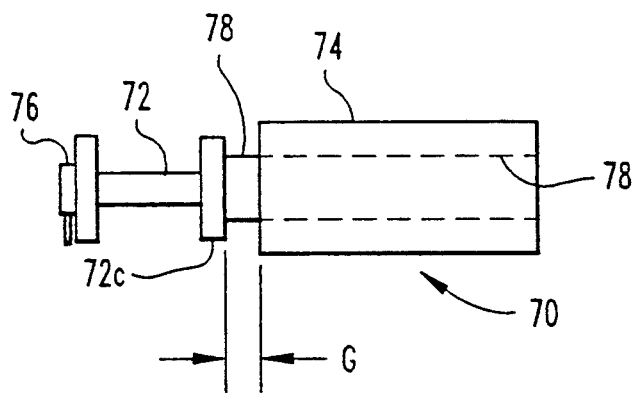
FIG. 10 is a side elevation view of a fifth embodiment of the Hall effect position sensor according to the present invention.

Referring now to FIG. 10, another embodiment of the position sensor 70 according to the present invention is shown. Sensor 70 includes Hall effect device 76 identical to Hall device 16, pole piece 72 identical to pole piece 12 of FIG. 1, hollow cylindrical magnet 74 attached to ferrite rod or core 78 at a distance G from the magnetic coupling member 72c of pole piece 72. Distance G may be as small as 0.0 inches if desired, or increased accordingly to limit magnetic coupling between the magnet and the pole piece. The soft ferrite core material comprising core 78 has a permeability that changes with temperature. As temperature increases, the permeability or $\mu$, of the core 78 decreases. Thus, if the Hall device 76 is less sensitive at higher temperatures, the change in permeability of the soft ferrite core material serves to compensate for the loss in sensitivity of the Hall device, thereby providing more consistent operating characteristics for the sensor 70 over a broader range of temperatures.

For purposes of convenient packaging the sensors 10, 30, 50, 60, and 70 may be encapsulated or potted. Certain gear tooth sensor installations require a sensor which screws into a threaded hole, thus packaging the sensors so that the Hall device is centered on the corresponding pole piece assures accurate positioning of the Hall device with respect to the gear or tone wheel when the sensor is packaged in a screw-in housing (not shown) and must be positioned by screwing the housing in and out of a mounting location.

Referring now to FIG. 11, another embodiment of a position sensor 90 according to the present invention is shown. The sensor 90 includes Hall effect device 16, magnet 92, internally threaded aluminum insert 94, steel washers or pole pieces 96 and 98, and steel machine screw 100. Functionally speaking, the sensor 90 is an alternate version of the sensor 30 of FIG. 5. Specifically, the sensor 90 includes an aluminum insert 94 to reduce or limit magnet fringing from sensor 30 of FIG. 5, an adjustable flux return means or flux return guide 100, and a pole piece having flux dispersion characteristics similar to pole piece 32 of FIG. 5 when attached to magnet 92. An air gap is established by the position of the flux return guide 100 within insert 94 relative to the pole piece 98 thereby providing a flux limiting means for controlling flux levels transmitted to and appearing across the face of pole piece 98. Hole 94b is tapped to produce threads for receiving the threads of screw 100. Hall effect device 16 is attaced to pole piece 98 over hole 98b. Pole piece 98 abuts surface 92a and 94a in sensor 90. The magnet 92 and insert 94 are equal in axial height, thus pole piece 96 also abuts both magnet 92 and insert 94 of the sensor 90. The pole piece surface 98a is significantly larger than the radial cross-section of magnet 92 which corresponds with the the area of surface 92a of magnet 92, thus resulting in dispersion of the flux from magnet 92 evenly across the pole piece surface 92a. Alternatively, a fixed position flux return guide may substitute for the screw 100 once the magnetic characteristics of the sensor 90 are well known from testing of dimensionally stable sensor components.

While the invention has been illustrated and described in detail in the drawings and foregoing description, the same is to be considered as illustrative and not restrictive in character, it being understood that only the preferred embodiment has been shown and described and that all changes and modifications that come within the spirit of the invention are desired to be protected.

What is claimed is:

1. A Hall effect position sensor for sensing movement of a metallic object such as a gear or tone wheel, comprising:
   a Hall effect device;
   a disk-shaped pole piece having a flux return means protruding from the central portion of said disk-shaped pole piece;
   a ring-shaped pole having a hole centrally located therein;
   first and second magnets of equal length and attached between said disk-shaped pole piece and said ring-shaped pole piece so that said flux return means is positioned substantially between said magnets;
   said first and second magnets supplying magnetic flux to said disk-shaped pole piece and said flux return means returning magnetic flux from said disk-shaped pole piece to said ring-shaped pole piece to complete a magnetic circuit between said first and second magnets and said ring-shaped and disk-shaped pole pieces; and
   wherein said Hall effect device is attached to said ring-shaped pole piece and located adjacent said hole, said Hall effect device producing an output signal in response to a magnetic flux level at said Hall effect device in excess of a predetermined limit.

2. The sensor of claim 1 wherein said flux return means is a cylindrical protruding member.

3. The sensor of claim 2 wherein said cylindrical protruding member includes an adjustable member movable toward said ring-shaped pole piece.

4. The sensor of claim 2 wherein said flux return means includes means for variably shunting magnetic flux between said disk-shaped pole piece and said ring-shaped pole piece.

5. The sensor of claim 4 wherein said flux return means has a threaded hole therethrough and said means for variably shunting magnetic flux is a steel screw installed in said threaded hole.

6. A position sensor for sensing movement of a metallic object such as a gear or tone wheel, said sensor having a loaded state which occurs when said sensor senses a metallic object and an unloaded state which occurs when said sensor senses a void, said sensor comprising:
   Hall effect means for producing an output signal in response to magnetic flux levels in excess of a predetermined limit;
   magnetic means for producing a first level of magnetic flux in excess of said predetermined limit; and
   means for conducting magnetic flux produced by said magnetic means to said Hall effect means, said conducting means including means for limiting magnetic flux and means for dispersing magnetic flux, said Hall effect means being attached to said dispersing means;
   wherein said limiting means receives said first level of magnetic flux from said magnetic means and supplies a reduced second level of magnetic flux to said dispersing means, and said dispersing means disperses said second level of magnetic flux below said predetermined limit at said Hall effect means when said sensor is in its unloaded state, said Hall effect means producing an output signal when said sensor is in its loaded state in response to magnetic flux levels in excess of said predetermined limit.

7. The sensor of claim 6 wherein said Hall effect means is a Hall effect IC.

8. The sensor of claim 6 wherein said magnetic means is a rare earth magnet.

9. A position sensor for sensing movement of a metallic object such as a gear or tone wheel, said sensor having a loaded state which occurs when said sensor senses a metallic object and an unloaded state which occurs when said sensor senses a void, said sensor comprising:
   Hall effect means for producing an output signal in response to magnetic flux levels in excess of a predetermined limit;
   magnetic means for producing a first level of magnetic flux in excess of said predetermined limit; and
   means for conducting magnetic flux produced by said magnetic means to said Hall effect means, said conducting means including means for limiting magnetic flux and means for dispersing magnetic flux, said Hall effect means being attached to said dispersing means;
   wherein said limiting means receives said first level of magnetic flux from said magnetic means and supplies a reduced second level of magnetic flux to said dispersing means, and said dispersing means disperses said second level of magnetic flux below said predetermined limit at said Hall effect means when said sensor is in its unloaded state, said Hall effect means producing an output signal when said sensor is in its loaded state in response to magnetic flux levels in excess of said predetermined limit;
   wherein said means for conducting magnetic flux includes a disk-shaped pole piece having a flux return means protruding from the central portion of said disk-shaped pole piece as means for limiting flux and a ring-shaped pole piece having a hole centrally located therein as means for dispersing flux; and
   wherein said magnetic means is attached between said disk-shaped pole piece and said ring-shaped pole piece, said magnetic means supplying magnetic flux to said disk-shaped pole piece and said flux return means returning magnetic flux from said disk-shaped pole piece to said ring-shaped pole piece to complete a magnetic circuit between said magnetic means and said ring-shaped and disk-shaped pole pieces.

10. The sensor of claim 9 wherein said magnetic means for conducting magnetic flux includes first and second magnets of equal length and attached between said disk-shaped pole piece and said ring-shaped pole piece so that said flux return means is positioned substantially between said magnets.

* * * * *

UNITED STATES PATENT AND TRADEMARK OFFICE
CERTIFICATE OF CORRECTION

PATENT NO. : 5,264,792
DATED : November 23, 1993
INVENTOR(S) : Robert Luetzow, et al.

It is certified that error appears in the above-identified patent and that said Letters Patent is hereby corrected as shown below:

At Col. 8, line 56, replace "92a" with --98a--.

Signed and Sealed this

Seventeenth Day of May, 1994

Attest:

BRUCE LEHMAN

Attesting Officer    Commissioner of Patents and Trademarks